(12) United States Patent
Okamoto et al.

(10) Patent No.: US 7,155,353 B2
(45) Date of Patent: Dec. 26, 2006

(54) METHOD FOR DETERMINING CHARGING CAPACITANCE OF CAPACITOR

(75) Inventors: Mitsuyasu Okamoto, Himeji (JP); Shingo Oda, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 404 days.

(21) Appl. No.: 10/420,700

(22) Filed: Apr. 23, 2003

(65) Prior Publication Data

US 2004/0095024 A1 May 20, 2004

Related U.S. Application Data

(60) Provisional application No. 60/376,808, filed on May 2, 2002.

(30) Foreign Application Priority Data

Apr. 25, 2002 (JP) ............................. 2002-123641
Apr. 15, 2003 (JP) ............................. 2003-110594

(51) Int. Cl.
*G06F 19/00* (2006.01)
(52) U.S. Cl. ................. 702/65; 102/206; 102/208; 280/728.1; 280/735; 280/736
(58) Field of Classification Search ............ None
See application file for complete search history.

(56) References Cited

U.S. PATENT DOCUMENTS

| 4,819,560 A | | 4/1989 | Patz et al. |
| 5,957,988 A | * | 9/1999 | Osajda et al. ............. 701/45 |
| 6,166,653 A | | 12/2000 | Schulmeyer et al. |
| 6,225,707 B1 | | 5/2001 | Hermann |
| 6,418,853 B1 | | 7/2002 | Duguet et al. |
| 6,460,884 B1 | * | 10/2002 | Nakashima et al. ........ 280/741 |
| 6,490,976 B1 | * | 12/2002 | Fisher et al. ................ 102/215 |
| 6,622,628 B1 | * | 9/2003 | Fisher et al. ................ 102/215 |
| 6,820,557 B1 | * | 11/2004 | Okamoto et al. ........... 102/218 |

(Continued)

FOREIGN PATENT DOCUMENTS

EP        1030158 A1      8/2000

(Continued)

OTHER PUBLICATIONS

Munger, A.C., "Electrothermal Response Testing, A Component Development Tool," Seventh International Pyrotechnics Seminar, Jul. 1980, pp. 461-478, vol. 1, IIT Research Institute, Vail, Colorado.

*Primary Examiner*—Patrick J. Assouad
(74) *Attorney, Agent, or Firm*—Birch, Stewart, Kolasch & Birch, LLP

(57) ABSTRACT

A method of determining a charging capacitance of a capacitor in an air bag system having an electronic control unit for controlling a gas generator, a bus line having a loop wire extending from the electronic control unit, gas generators connected to the loop wire, each gas generator having an igniter connected to the loop wire via a connector, one of the igniter and the connector being provided with an integrated circuit having the capacitor for providing power to a heat generating portion, a switching circuit for turning ON/OFF a supplying of current to the heat generating portion, and a microcomputer unit for controlling the switching circuit, the method including, determining a minimum charging capacitance of the capacitor necessary to operate the igniter based on a charging voltage and a minimum ignition energy required for making the heat generating portion of the igniter generate heat to ignite the priming.

2 Claims, 13 Drawing Sheets

U.S. PATENT DOCUMENTS

| | | |
|---|---|---|
| 6,926,304 B1 * | 8/2005 | Miyaji et al. ............ 280/741 |
| 2001/0054846 A1 * | 12/2001 | Boezen et al. ........... 307/10.1 |
| 2003/0101888 A1 * | 6/2003 | Fisher et al. ............ 102/200 |
| 2003/0168840 A1 * | 9/2003 | Hanazaki et al. ......... 280/735 |
| 2003/0234527 A1 * | 12/2003 | Okamoto et al. .......... 280/741 |
| 2004/0041552 A1 * | 3/2004 | Okamoto et al. .......... 323/318 |
| 2004/0084882 A1 * | 5/2004 | Okamoto et al. .......... 280/735 |
| 2004/0103811 A1 * | 6/2004 | Okamoto et al. ........ 102/202.5 |
| 2004/0104562 A1 * | 6/2004 | Okamoto et al. .......... 280/741 |
| 2004/0260743 A1 * | 12/2004 | Okamoto et al. .......... 708/801 |

FOREIGN PATENT DOCUMENTS

| | | |
|---|---|---|
| JP | 2707250 B2 | 10/1997 |
| JP | 2000-211470 A | 8/2000 |
| JP | 2000-241098 A | 9/2000 |
| JP | 2000-513799 A | 10/2000 |
| JP | 2001-341612 A | 12/2001 |
| JP | 2001-525288 A | 12/2001 |
| WO | WO 99/02937 A1 | 1/1999 |

* cited by examiner

METHOD FOR DETERMINING CHARGING CAPACITANCE OF CAPACITOR

This nonprovisional application claims priority under 35 U.S.C. § 119(e) on U.S. Provisional Application No(s). 60/376,808 filed on May 2, 2002 and under 35 U.S.C. § 119(a) on Patent Application No(s). 2002-123641 and 2003-110594 filed in Japan on Apr. 25, 2002 and Apr. 15, 2003, which is/are herein incorporated by reference.

BACKGROUND OF THE INVENTION

1. Field of the Invention

The present invention relates to a method of determining an optimal capacitance of a capacitor used in an air bag system utilizing a bus line, and an air bag system utilizing a bus line.

2. Description of Related Art

An air bag system for protecting a passenger from an impact at a time of collision of a vehicle is indispensable, and air bag system needs to be reduced in weight from a demand of reducing weight of a whole vehicle. Recently, kinds and the total number of air bags such as an air bag for a driver side, an air bag for a passenger side next to the driver, an air bag for a rear seat, and an air bag for side collision are increasing, and therefore, a lighter air bag system is in greater demand.

In a current air bag system, an electronic control unit (ECU) connected to a power source (a battery in a vehicle) and an impact detecting sensor is individually connected to respective gas generators (a gas generator and an air bag are accommodated in a module case). An aspect of the connection between the ECU and the individual gas generators is shown in FIG. 8.

As shown in FIG. 8, the ECU and an igniter (FIG. 9) of each of the individual gas generators are always connected to each other through two conductors (lead wires), and therefore, twice the number of conductors as compared to the total number of igniters are required. Having many conductors contributes largely to weight increase in the air bag system. In view of constraints at a time of assembling vehicle parts, the ECU and the individual gas generators are connected not only by the conductors but by connecting a plurality of conductors via a plurality of connectors, and thereby, there occurs a serious problem such as a weight increase due to these connectors and a cost increase due to increase of the number of the connectors. Further, increase in weight due to increase in volume of the capacitor assembled in the ECU as a backup power source (in case of disconnection between the power source and the ECU) for activating all of the igniters cannot be ignored.

Furthermore, in the air bag system shown in FIG. 8, lead wires and many connectors are interposed between a heat generating portion of the igniter and the ECU. Considering a resistance value due to these members (usually, about 4Ω), a resistance of the heat generating portion can not be set to not more than 1.5Ω in order to detect a short circuit between the heat generating portion and the ECU on the basis of a voltage difference therebetween.

In view of the above, a trial for reducing the weight of a conductor required to connect between the ECU and each gas generator by using a bus system in the air bag system has been examined. An aspect of the air bag system utilizing this bus system is shown in FIG. 1.

As shown in FIG. 1, an air bag system is constituted by providing bus lines comprising a plurality of loop wires passing through the ECU and connecting each gas generator to the bus line through two conductors (three or more conductors when occasion demands). In the case of such an air bag system as shown in FIG. 1, since only a required gas generator is activated according to a collision of a vehicle, an integrated circuit receiving information transmitted from the ECU and a capacitor supplying current to make the heat generating portion in the igniter generate heat are provided in each gas generator. In the case of using a bus system, the total number of capacitors is increased, but since the capacitors are distributed to the ECU and the respective igniters, the capacitance and weight of the capacitor per one igniter is reduced. Therefore, they are remarkably reduced in weight as compared to the capacitor for backup in the air bag system shown in FIG. 8. Accordingly, a large weight reduction is achieved in the whole system in addition to reducing large amount of using conductors, which is expected to be put in a practical use in the air bag system. In this case, as the prior art using the bus system, JP-A 2000-241098, JP-A 2000-513799 and JP-B 2707250 are known.

Further, in the air bag system shown in FIG. 1, since a distance between the heat generating portion of the igniter and the integrated circuit is shorter than a distance between the heat generating portion of the igniter and the ECU shown in FIG. 8 and it is unnecessary to detect a short circuit, the resistance of the heat generating portion of the igniter can be not more than 1Ω. At this time, an amount of power consumed in the heat generating portion may be low, so that a size of the capacitor can be made small. This is much advantageous in view of providing a capacitor or the like in a limited small space inside the igniter. In the air bag system shown in FIG. 1, however, as the resistance value of the heat generating portion of the igniter has been made small, influence of resistance values of other elements can not be ignored. For this reason, in the air bag system shown in FIG. 1, considering the resistance value of the heat generating portion and the other elements totally and energy to be consumed, it becomes important to optimize the capacitance of the capacitor in order to supply current, which is sufficient for a normal operation, to the heat generating portion.

In JP-A 2001-525288, as an ignition circuit utilizing a bus system and a method of activating the ignition circuit, there is disclosed that a charging voltage to a capacitor is set to be a charging voltage corresponding to 2 to 2.4 times a product of the minimum ignition current and a resistance value of a heat generating portion [V=(2.0–2.4)×IR] and that a capacitor capacitance is set to be 1.0 to 1.2 times the minimum time T divided by an internal resistance R [C=(1.0–1.2)×T/R]. In this related art, however, a resistance value of elements other than the heat generating portion is not accounted and the ground of such a numerical value as 2–2.4 or 1.0–1.2 is not shown, either. Furthermore, although such an extra charging voltage or charging capacitance is expected, the resistance value of elements other than the heat generating portion or the like is not accounted, so that, when an amount of power consumed at these portions is large, the heat generating portion does not generate heat sufficiently.

SUMMARY OF THE INVENTION

The present invention provides a method of determining an optimal charging capacitance of a capacitor for operating an air bag system normally in case of an air bag system including a bus system, and an air bag system using a bus line.

One aspect of the present invention provides, as one means for solving the above problem, a method of determining a charging capacitance of a capacitor in an air bag system comprising an electronic control unit connected to a power source, an impact detecting sensor, and a plurality of module cases which are connected to the electronic control unit, and accommodate a plurality of gas generators and air bags, a bus line comprising a plurality of loop wires which pass through the electronic control unit and supply and transmit currents and required information, gas generators individually connected to be activated by a plurality of conductors branched at predetermined portions from the bus line, an igniter provided in each of the a plurality of gas generators and having a capacitor and an integrated circuit, and a switching circuit provided in the integrated circuit to turn ON/OFF of supplying current to a heat generating portion of the igniter, wherein the lowermost charging capacitance of the capacitor required to operate the air bag system normally is obtained by the following formula (I):

$$C=2E/V^2 \quad (I)$$

(In the formula, C represents a capacitor charging capacitance, V represents a charging voltage, and E represents the minimum ignition energy required for making the heat generating portion of the igniter generate heat to ignite a priming, which is obtained by the following formula (II):

$$E=I_{min}^2 \times (R_{max}+r_1+r_2) \times T + w \times 10 \quad (II)$$

$I_{min}$: the minimum ignition current value (A)

$R_{max}$: the maximum resistance value of the heat generating portion (Ω)

$r_1$: an ON resistance value of the switching circuit (the maximum ON resistance value at 150° C.)(Ω)

$r_2$: a resistance value of the other elements (Ω)

T: a time period during which a current flows in the heat generating portion (sec)

w: a power consumed by the whole integrated circuit when the switching circuit is OFF (In this case, 10 in w×10 means the maximum time period elapsed from the first collision to the second collision caused at a vehicle collision.))

The switching circuit is specifically a switching element (a MOS-FET or the like), and the ON resistance value thereof represents the resistance value (ON resistance value) when the switching element has been closed. It is preferable that, in a single heat generating portion, there is one switching element for each of an upstream side and a downstream side of the heat generating portion, namely, there are two switching elements in total. In this case, the resistance value of the switching circuits corresponds to the total of the resistance values of the respective switching circuits. In FIG. 5, a single switching circuit is provided on each of the upstream side and the downstream side of the heat generating portion, and when the respective ON resistance values thereof are represented by $r_a$ and $r_b$, $r_1=r_a+r_b$ is obtained. In case that there are two heat generating portions as shown in FIG. 6, when resistance values of switching elements connected to a first heat generating portion are represented by $r_a$ and $r_b$, and resistance values of switching elements connected to a second heat generating portion are represented by $r_c$ and $r_d$, $r_1=[(r_a+r_b)(r_c+r_d)]/(r_a+r_b+r_c+r_d)$ is obtained because the circuits in the heat generating portion are parallel.

When the switching circuit is OFF, electricity stored in the capacitor does not flow in the heat generating portion, but the integrated circuit consumes a certain amount of power to recognize an actuation signal or the like. For example, in an air bag system applied to an air bag for a side collision (or a curtain air bag), assuming a line connecting a battery and an ECU is disconnected simultaneously with detection of the first collision. At this collision, air bags for a driver side and for a passenger side next to the driver develop, but it is further expected that, after a certain time (for example, 6 seconds) elapsed during a side slippage of the vehicle is caused, the vehicle side-collides another obstacle, and an air bag for a side collision (a curtain) develops. At this time, in an igniter for the air bag for a side collision (a curtain), it is necessary to store, in the capacitor, energy for operating the integrated circuit for 6 seconds from the first collision (the disconnection) and further for making the heat generating portion generate heat sufficiently. Since it is generally assumed that the maximum time from the first collision of a vehicle to the second collision caused by a lateral turning or the like is 10 seconds, w×10 is employed in the formula (II) in view of these times.

Therefore, $I_{min}^2 \times (R_{max}+r_1+r_2) \times T$ in the formula (II) represents energy which the heat generating portion substantially consumes in order to generate heat for T time period, and w×10 represents energy which the integrated circuit consumes for 10 seconds.

The charging voltage (V) is determined on the basis of a boost voltage when a built-in integrated circuit has a boost circuit (a circuit amplifying a charging voltage), and it is determined on the basis of a voltage of a rectifying circuit when a boost circuit is not provided. There is a drawback such that, when the charging voltage is high, a capacitor with a high voltage proof is required and that a capacitor capacitance storing necessary energy therein must be made large when the charging voltage is too low. It is preferable that the charging voltage is about 20 V.

The invention also provides, as one means for solving the above problem, an air bag system comprising an electronic control unit connected to a power source and an impact detecting sensor, and a plurality module cases which are connected to the electronic control unit and accommodate a plurality of gas generators and air bags, wherein in the air bag system, a bus line comprising a plurality of loop wires which pass through the electronic control unit and supply and transmit currents and required information is provided, and individual gas generators are connected to be activated by a plurality of conductors branched at predetermined portions from the bus line, each of one or more igniters incorporated in the gas generator is each an electric type igniter provided with a heat generating portion and a priming in contact with the heat generating portion, the igniter is connected to a bus line by a plurality of conductors via a connector having a lead wire, and a capacitor and an integrated circuit recorded with information to exhibit required functions is provided between the igniter and the bus line, and a current for igniting the priming is supplied to the one or more igniters through the capacitor.

Preferably, the integrated circuit recorded with information to exhibit at least the required functions is provided inside the connector.

By providing the capacitor and the integrated circuit recorded with information to exhibit required functions between the igniter and the bus line, preferably in the connector, attachment of the capacitor and the integrated circuit is facilitated.

The numbers of the loop wires forming the bus line and the conductors connecting the bus line and the gas generator may be two, three, four or more, respectively, but, in view of simplifying the entire system, two is preferable.

The priming is not limited to a specific one, but a combination of a metal or the like and an oxidizing agent such as perchlorate is preferable, a combination of a metal such as zirconium, titanium, and hafnium and perchlorate is more preferable, and a mixture (ZPP) of zirconium and potassium perchlorate is particularly preferable. Desirably, the ZPP is formed in a particle shape and particle diameters of zirconium and potassium perchlorate are adjusted.

A capacitance of the capacitor is preferably not more than 24 µF, more preferably not more than 12 µF, further preferably not more than 6 µF.

In the air bag system of the above-described invention, preferably, a current for igniting the priming is supplied to the one or more igniters through the capacitor in the integrated circuit, and the above igniter is activated such that the time period of the supplying the current is from the point where a current value reaches the current value corresponding to 5% of the maximum current value to the point where the current value is reduced down to the value corresponding to 5% of the maximum current value, which is within 500 µsec. In this case, the maximum current value in the time period of supplying a current is a current value sufficient to ignite the priming. The time period of supplying a current is preferably within 200 µsec, and more preferably within 100 µsec. Incidentally, a current value at this time varies depending on a resistance value of the heat generating portion in the igniter, and it is determined on the basis of presence or absence of the discharging waveform converting circuit, the constitution of the discharging waveform converting circuit, a particle diameter of a priming, a shape of the heat generating portion and the like.

In case of a conventional air bag system, since current for activating an igniter flows from a power source (a battery) with a relatively large capacitance at 1.2 A for about 2 msec, that is, at a relatively low current for a relatively long time, a waveform of an ignition current (a vertical axis denotes a current value (A) and a horizontal axis denotes a time (µsec)) becomes rectangular.

In the present invention, however, since current for activating an igniter is supplied from a capacitor with a relatively small capacitance, it is preferable that a relatively high current flows for a short time, because ignition of the igniter is made smoother and ignition energy itself can be made smaller. The waveform of the ignition current at this time (a vertical axis denotes a current value (A) and a horizontal axis denotes a time (µsec)) becomes a discharging waveform expressed by the following formula (I) when discharging starts at a time t=0:

$$i(t) = (V0/R) \times e^{-t/CR} \quad \text{(I)}$$

(In the formula, v0 represents a capacitor charging voltage (V), R represents a circuit resistance (Ω), C represents a capacitor capacitance (µF), t represents a time (µsec), and i represents a current (A)).

When such a discharging waveform expressed by the formula (I) is employed, a current value becomes larger than a conventional rectangular waveform, but a current conduction time is shortened. Therefore, the ignition energy itself is reduced largely.

In the above invention, when a period during which a stable current supplying is being maintained after reaching a desired current value is defined as t (µsec) and a time period from a start of waveform rising to stopping of current supplying for causing the heat generating portion to generate heat is defined as T (µsec), it is preferable that a relationship (t/T) between these t and T is in the range of $0 \leq t/T < 0.2$ or $0.5 < t/T < 1$.

In the case of $0 \leq t/T < 0.2$, a waveform of a current is similar to a discharging waveform (a waveform similar to a triangle) obtained when electricity stored in the capacitor is applied to the heat generating portion directly. In the case of $0.5 < t/T < 1$, a waveform of a current is similar to a waveform (a waveform similar to a trapezoid) obtained when a discharging waveform is converted through a discharging waveform converting circuit for converting a waveform of current stored in a capacitor to a signal waveform of a current for igniting the priming or the like.

In the above invention, such a constitution can be employed that the capacitor and the integrated circuit having required functions are provided between each of all the igniters the bus line, and it is preferable that the constitution further includes a discharging waveform converting circuit. Further, the discharging waveform converting circuit is one having a function for converting the discharging waveform represented by the following formula (I) to a triangular waveform or a trapezoidal waveform. In addition, in order to provide a similar converting function, a coil can be interposed in a connecting circuit between the capacitor and the heat generating portion, and the discharging waveform converting circuit can further be provided in the integrated circuit in view of simplifying the entire system.

The information for exhibiting required functions which is recorded in the integrated circuit is the one recorded with information for exhibiting one or more functions selected from the group of (i) a function for detecting abnormality of the heat generating portion of the igniter in the gas generator, (ii) a function for identifying each of the plurality of gas generators and (iii) a function for detecting a malfunction of the capacitor. Additionally, it is preferable that (iv) a circuit for preventing the igniter from being activated erroneously due to a noise generated outside the igniter is provided in the igniter.

Usually the integrated circuit is provided with a basic function to activate a proper gas generator for protecting the passenger according to a situation of a vehicle collision upon receiving a signal from the ECU. In addition thereto, by providing the above various functions, quality check of a product at a time of shipping, workability at a time of assembling and safety at an actual use (while driving a vehicle) and the like can be improved properly.

(i) The function for detecting abnormality of the heat generating portion of the igniter in the gas generator:

As one of conditions required for the gas generator to activate normally, a contacting state between the heat generating portion of the igniter and the priming has to be good (the heat generating portion and the priming has to be brought in press-contact with each other). For example, when there is a gap between the heat generating portion and the priming, it is considered that there occurs a malfunction such that the priming is not ignited when the igniter is actuated or an ignition is delayed. Further, when the heat generating portion is disconnected or have been half-disconnected, a similar malfunction occurs. For this reason, by recording information for detecting the malfunction in the integrated circuit, an inferior product can be removed at a time of shipping, and by detecting abnormality at a practical use (while driving a vehicle), a prompt exchange can be performed.

Detecting theory for abnormality of the heat generating portion (Thermal Transient Test; issued on pages 461 to 478 in "Progress of International Pyrotechnic Seminar" on July 1980 by A. C. Munger) is as follows: when contacting state of a heat generating portion and a priming is good, most part of calorie generated by flowing of a constant current is conducted to the priming, so that the temperature of the heat generating portion does not rise so high. On the other hand, when the contacting state of the heat generating portion and the priming is bad, transfer of heat is less, so that the temperature rising of the heat generating portion becomes higher than a normal case. Therefore, a malfunction is detected by detecting a temperature change due to such a difference in contacting state as a resistance value change and utilizing a temperature coefficient of metal resistance [$r=r0\ (1+\alpha\Delta T)$] to obtain the temperature of the heat generating portion. More specifically, after a resistance r is measured when a current i which is too weak to raise the temperature up to igniting the igniter, a resistance R is measured when a current 1 of 10 to 15 times of the current i is flowed (the temperature of the heat generating portion becomes about 50 to 100° C., but the priming is not ignited with such a temperature), so that the resistance change due to the temperature change of the heat generating portion is obtained as a voltage change with comparisons of I and i and of R and r. Thus, such measurement information is recorded in the integrated circuit.

(ii) The function for identifying each plurality of gas generators:

For the gas generator for an air bag, various kinds of gas generators such as one for a driver side, one for a passenger side next to the driver, one for a side impact (for a side collision), one for a curtain air bag and the like have been practically used. For example, in the case of the gas generator for a side impact, the total of four gas generators are mounted for a driver side, a passenger side next to the driver, two rear seat sides respectively. For this reason, though different information pieces are recorded in the respective integrated circuits of the gas generators for the driver side, for the passenger side next to the driver, and for two rear seat sides, when these information pieces are recorded at a time of assembling the igniters or the gas generators or before assembling, since the igniters or the gas generators have the same appearance, it is necessary to distinguish the gas generators having the same appearance and having different information pieces recorded or the igniters having the same appearance before assembling such that a wrong one is not taken to store and transport them, which becomes much complicated.

Furthermore, with one for a driver side mounted to a vehicle erroneously as one for a passenger side next to the driver, when activation information of an air bag for a driver side is sent from the ECU, such an erroneous activation that an air bag for a passenger side next to the driver is inflated occurs eventually.

Therefore, by recording of information for developing identifying function for each plurality of gas generators after assembling of gas generators (when differences of gas generators can be recognized apparently), after gas generators are assembled in module cases (when differences of module cases can be recognized apparently) or after gas generators are mounted to a vehicle, storage, transportation, management and the like of gas generators can be made easy, so that a mistake or a confusion is prevented from occurring at a time of mounting of gas generators.

It is preferable that the information for developing an identifying function for each of the plurality of gas generators are recorded after assembling the gas generators, it is more preferable that the information pieces are recorded after the gas generators are assembled in the module cases, and it is further preferable that the information pieces are recorded after the module cases are mounted to a vehicle.

(iii) The function for detecting a malfunction of the capacitor:

The information for developing a function for detecting a malfunction of the capacitor also includes confirmation information of a mounted state (soldered state) of a capacitor to a substrate and the like in addition to information for measuring a pulse response or a dielectric dissipation factor.

After mounted to the vehicle, since the capacitor repeats charging and discharging, the capacitor deteriorates with age. However, abnormality is detected at a time of a practical use (while driving a vehicle) by recording information which can confirm a malfunction due to this deterioration in the integrated circuit in advance, so that a prompt exchange can be performed. Furthermore, by recording information for confirming the soldered state in advance, an inferior product can be removed at a time of shipping.

(iv) A circuit for preventing the igniter from being activated erroneously by a noise made outside the igniter (a noise countermeasure circuit).

For example, when large current flows at a time of activating a cell motor in a vehicle, in case of not providing a noise preventing circuit, there is a possibility that a noise (a noise causing an uncomfortable unusual sound occurrence while listening to the radio) generated due to this current is transmitted from a vehicle body to flow in an igniter. Due to the noise transmitted in this manner, a possibility that an igniter causes an erroneous activation becomes high. Accordingly, by mounting a device constituted to prevent current from flowing from a vehicle side to an igniter side, for example, a diode or a varistor (a non-linear resistance element) as the noise countermeasure circuit (a circuit for preventing an igniter from being activated erroneously), the above-described erroneous activation of the igniter can be prevented According to the method of determining a charging capacitance of a capacitor of the present invention, when an air bag system using a bus system is used, a charging capacitance of a capacitor sufficient to activate the air bag system normally can be determined regardless of the type of a vehicle, the kind of a gas generator and the total number of gas generators to be applied.

Further, according to the air bag system of the present invention, the weight of an entire air bag system can be reduced largely and an operation performance similar to a conventional one can be secured by using a bus system. Moreover, by providing a substrate between each gas generator (igniter) and a bus line (preferably, in a connector connected to an igniter), an attachment work of the substrate is facilitated.

DETAILED DESCRIPTION OF THE INVENTION

(1) First Embodiment

First, an air bag system in which a method of determining a charging capacitance of a capacitor according to the first embodiment of the invention will be explained with reference to FIG. 1 to FIG. 7.

Figure 1:
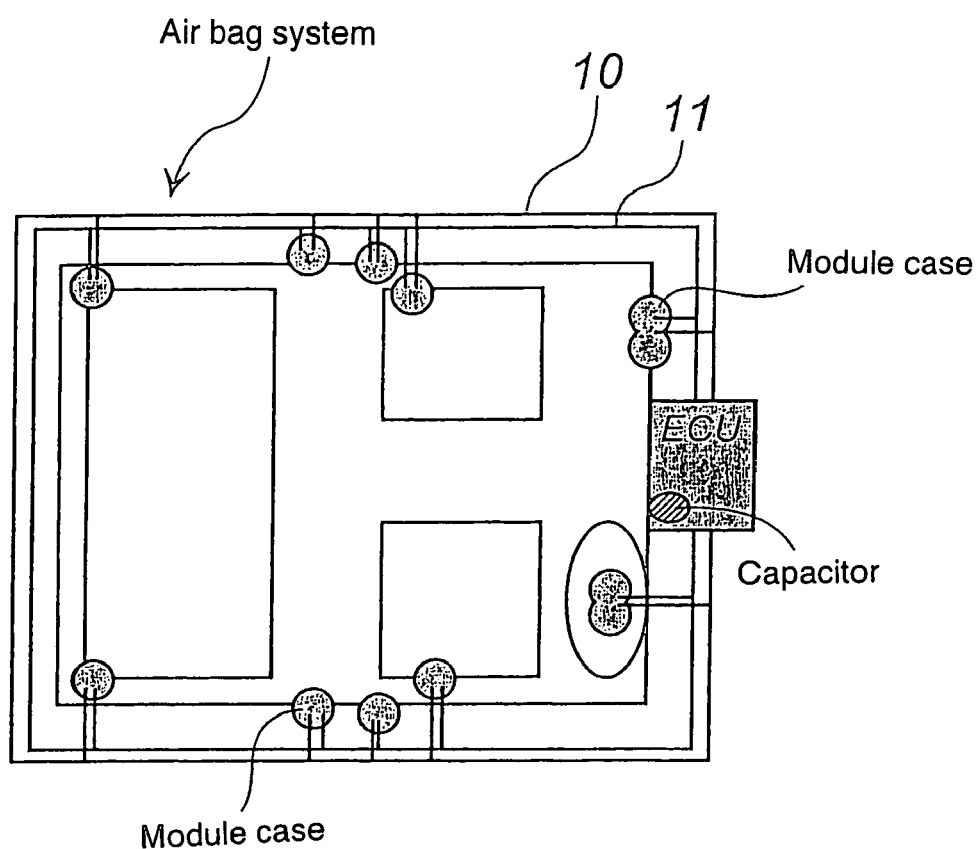
FIG. 1 is a diagram of an air bag system employing the present invention.
Figure 8:
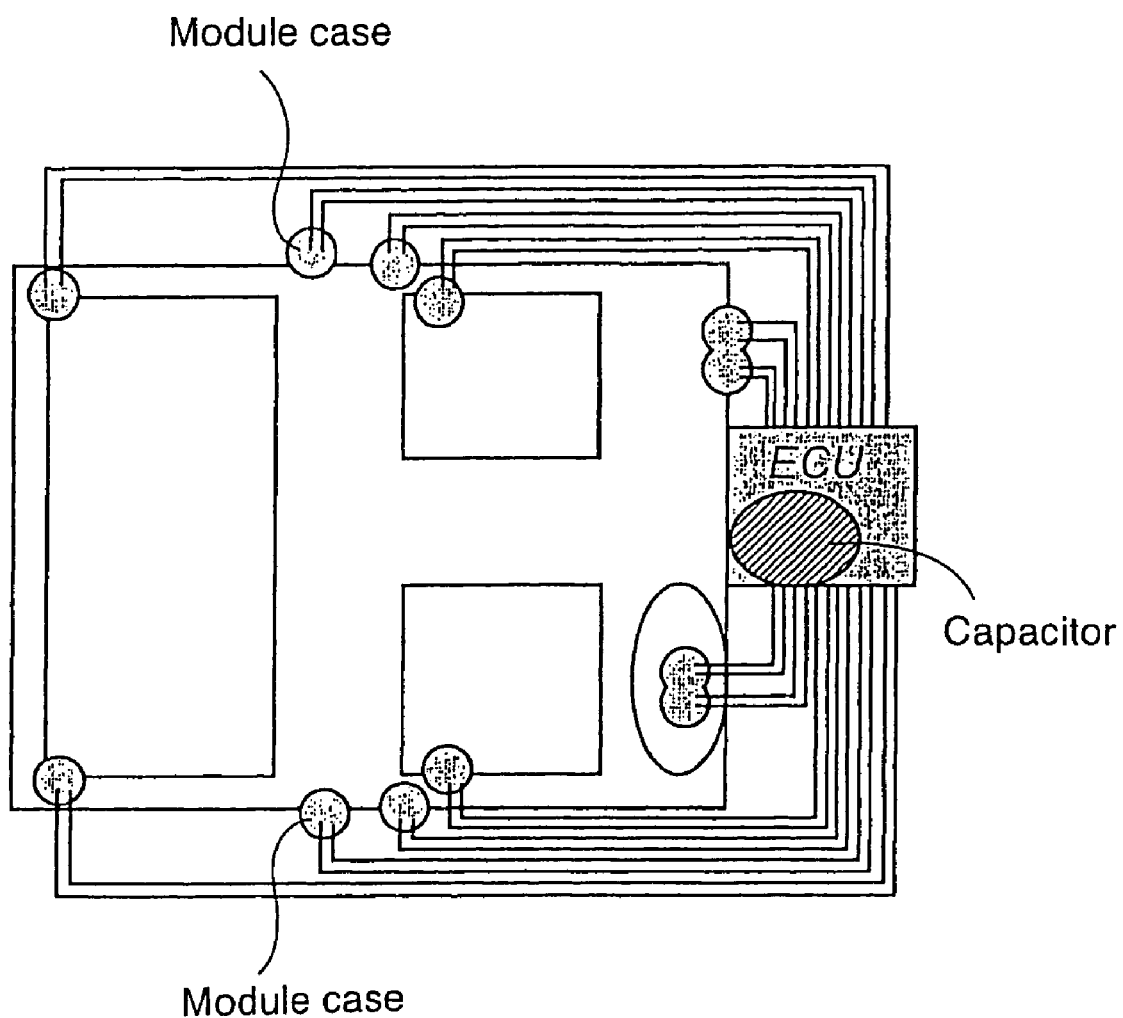
FIG. 8 is a diagram of a conventional air bag system.

As shown in FIG. 1, an air bag system employing a bus system uses bus lines 10 and 11 comprising two loop wires passing through an ECU. The ECU is connected to a power source (a battery in a vehicle) and an impact detecting sensor which are not illustrated, and a capacitor as a backup for supplying power when a conductor (a lead wire) connecting the ECU and the power source is disconnected by an impact at a collision of a vehicle, is disposed. Incidentally, in the air bag system shown in FIG. 1, since the capacitor is disposed at each gas generator (igniter), the capacitor for backup may have a small capacitance (i.e., light weight), but the capacitor for backup in the conventional air bag system shown in FIG. 8 has to have a large capacitance in order to activate all the gas generators by itself at a time of disconnection of a lead wire between the battery and the ECU.

The bus lines 10 and 11 and the gas generators in a required number of module cases (which are indicated by circles. The gas generator and an air bag are accommodated in the case.) mounted to a vehicle are connected by two conductors (or three or more conductors when occasion demands) to activate each gas generator.

Figure 2:
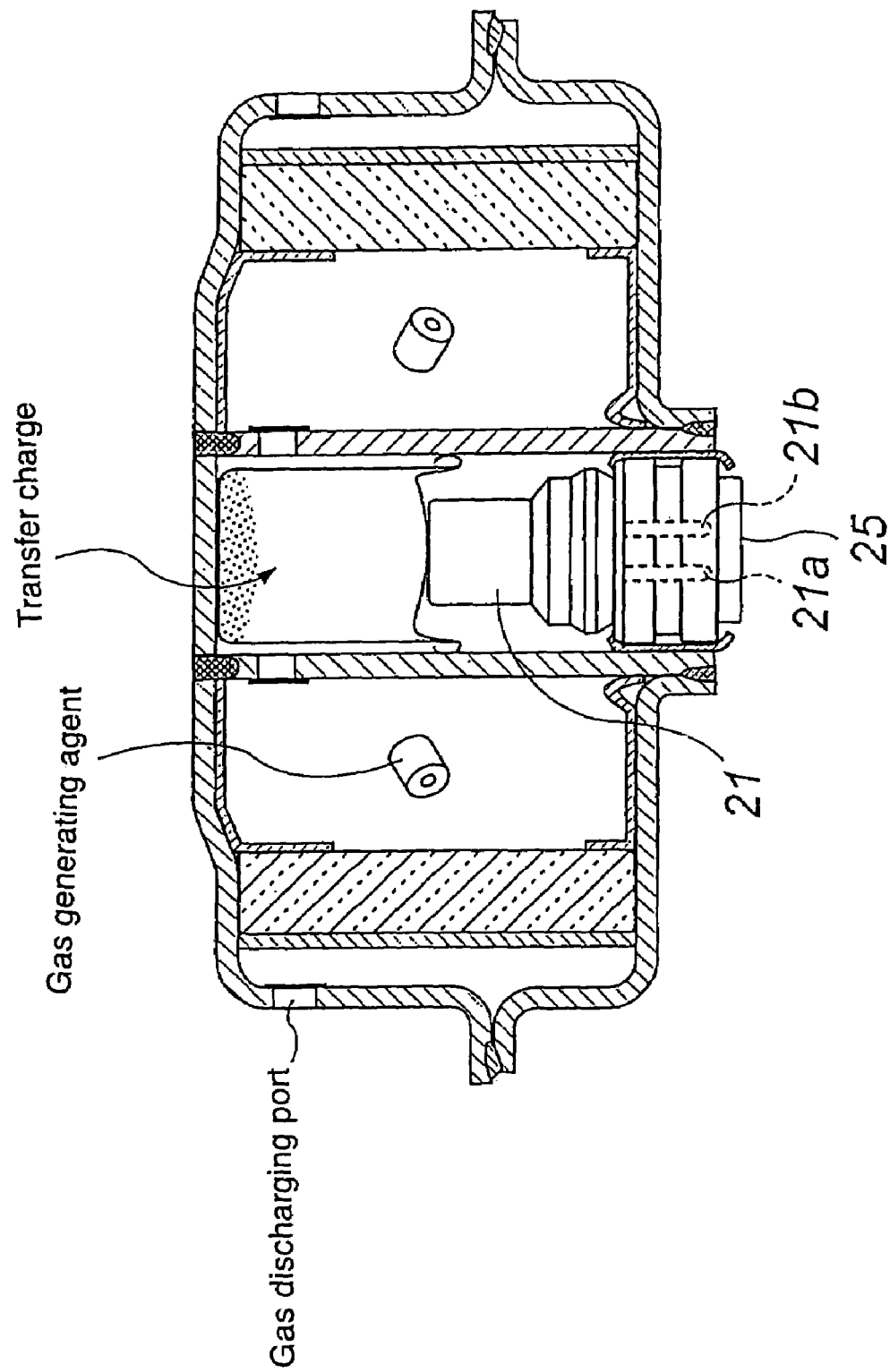
FIG. 2 is an axial sectional view of a gas generator (including a single igniter) used in the air bag system employing the present invention.
Figure 3:
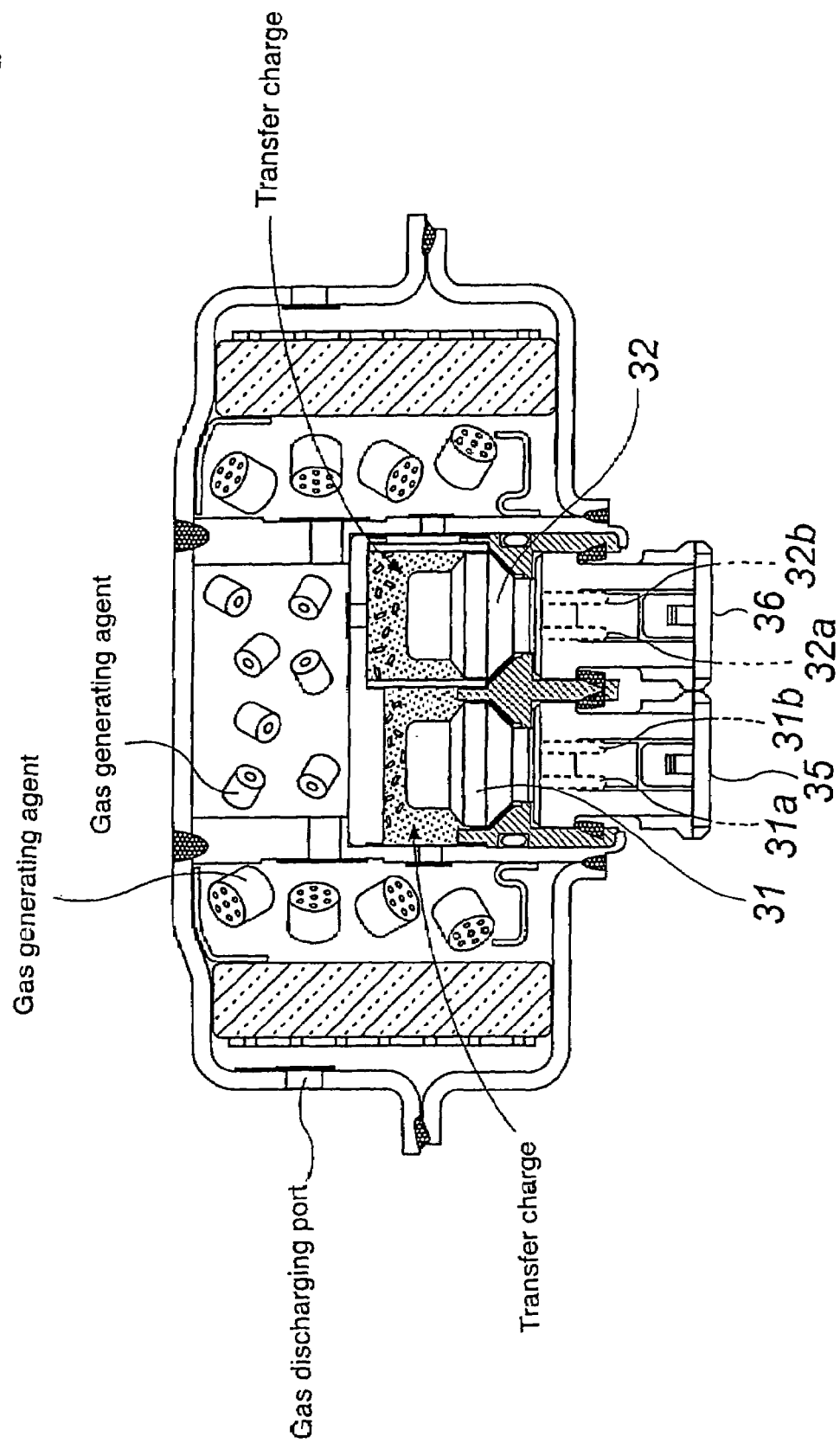
FIG. 3 is an axial sectional view of a gas generator (including two igniters) used in the air bag system employing the present invention.

As the gas generators in the module cases illustrated with circles in the air bag system shown in FIG. 1, ones shown in FIG. 2 or FIG. 3 can be used according to the number of the igniters. FIG. 2 is an axial sectional view of a single type (an igniter 21) gas generator in which one igniter is provided, and FIG. 3 is an axial sectional view of a dual type (igniters 31 and 32) gas generator in which two igniters are provided.

In the single type gas generator, two (or three or more when occasion demands) pins 21a and 21b are provided in the igniter 21 and they are connected to the bus lines 10 and 11 through a connector fitted into a connector insertion portion 25.

In the dual type gas generator, two (or three or more when occasion demands) pins 31a and 31b are provided in the igniter 31, two (or three or more when occasion demands) pins 32a and 32b are provided in the igniter 32, the igniters are respectively connected to the bus lines 10 and 11 through connectors fitted into connector insertion portions 35 and 36.

Figure 4:
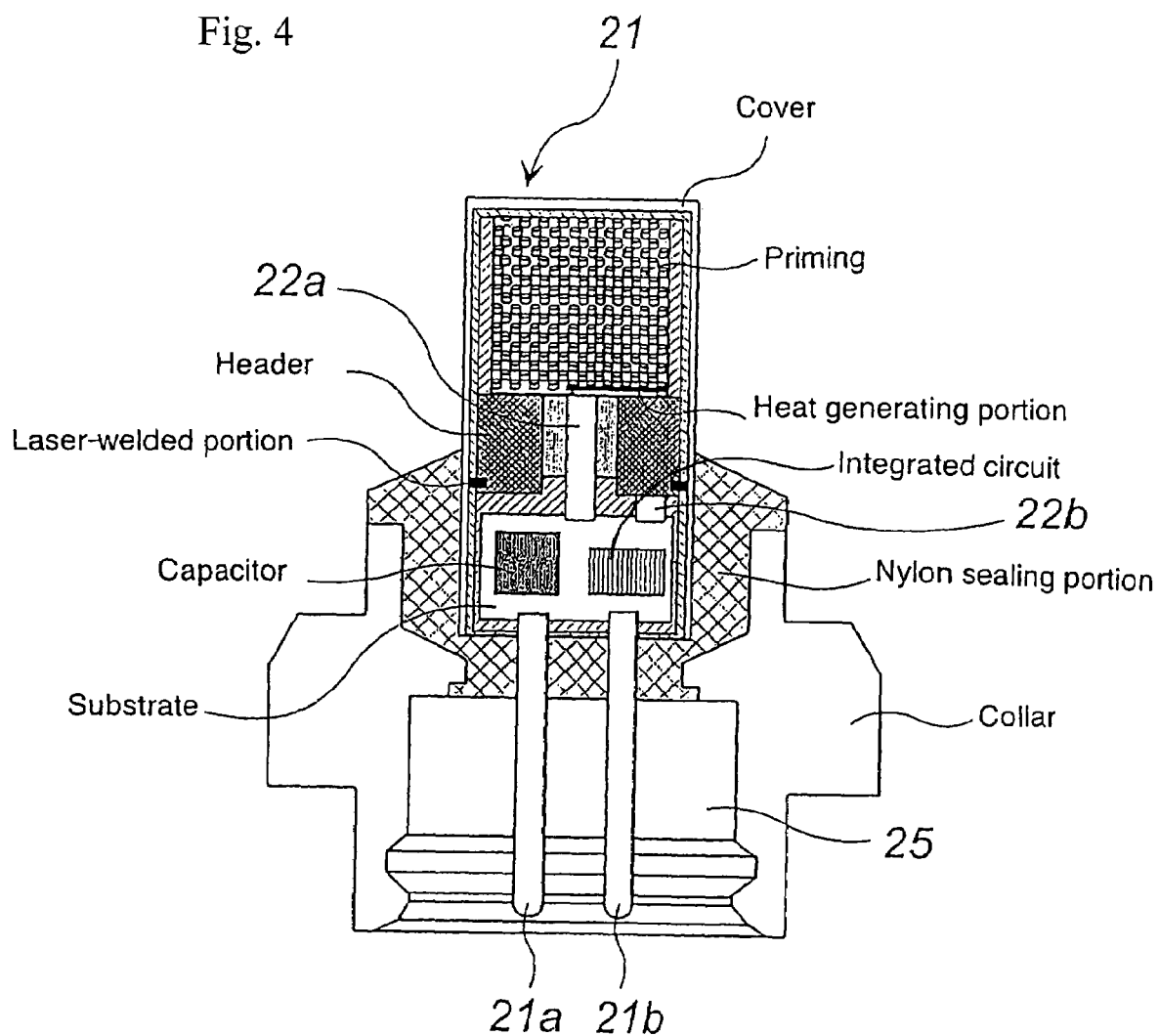
FIG. 4 is a vertical sectional view of an igniter used in the air bag system employing the present invention.

As the igniter 21 and the igniters 31 and 32 in the gas generators shown in FIG. 2 and FIG. 3, for example, one shown in FIG. 4 can be used. FIG. 4 shows a vertical schematic sectional view of an igniter, and since igniters having the same structure can be used as the igniter 21, the igniters 31 and 32, the igniter 21 will be explained below.

A heat generating portion is provided on a glass header, an igniting agent [for example, a mixture of zirconium/potassium perchlorate (ZPP)] is charged to be in press-contact with the heat generating portion, and a substrate provided with a capacitor and an integrated circuit recorded with information to exhibit required functions is disposed in a lower portion of the igniter 21. The heat generating portion is formed by employing a method of welding a wire for heat generation for attachment or the like. The heat generating portion is in contact with the priming, and it generates heat by a current supplied only from the capacitor to ignite the priming.

The integrated circuit, and the heat generating portion and the capacitor are respectively connected by two conductors, and the integrated circuit is further connected to pins 21a and 21b through the conductors.

The integrated circuit is recorded with information to receive a command from the ECU at least at a collision of a vehicle for inflating a required air bag. In addition, information for exhibiting one or more functions, when required, for example, selected from the group of a function for detecting abnormality of the heat generating portion of the igniter in the gas generators, a function for identifying each of the plurality of gas generators and a function for detecting a malfunction of the capacitor, can be recorded in the integrated circuit.

Figure 5:
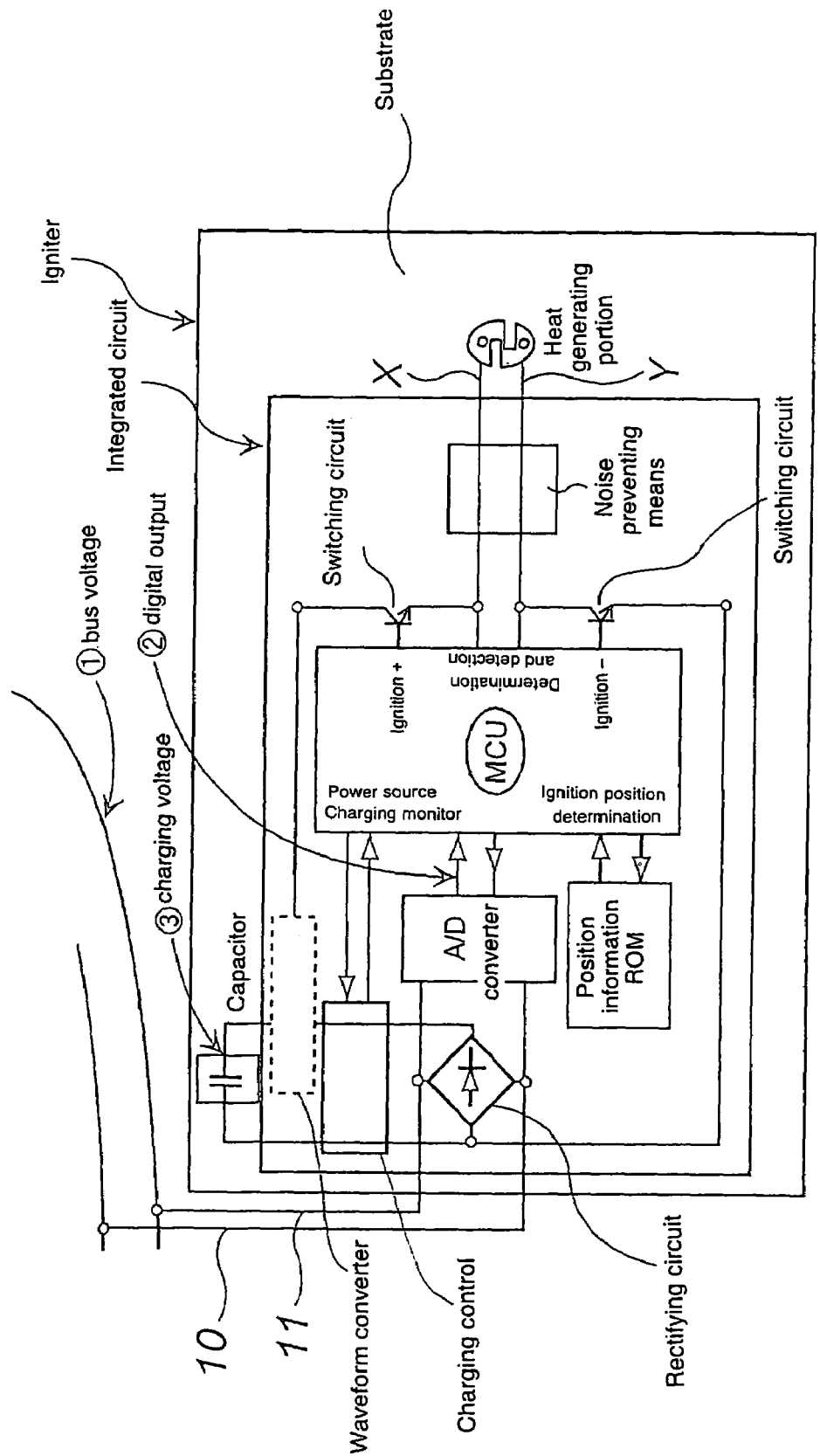
FIG. 5 is a conceptual diagram of an igniter (including a single heat generating portion) used in the air bag system employing the present invention.
Figure 6:
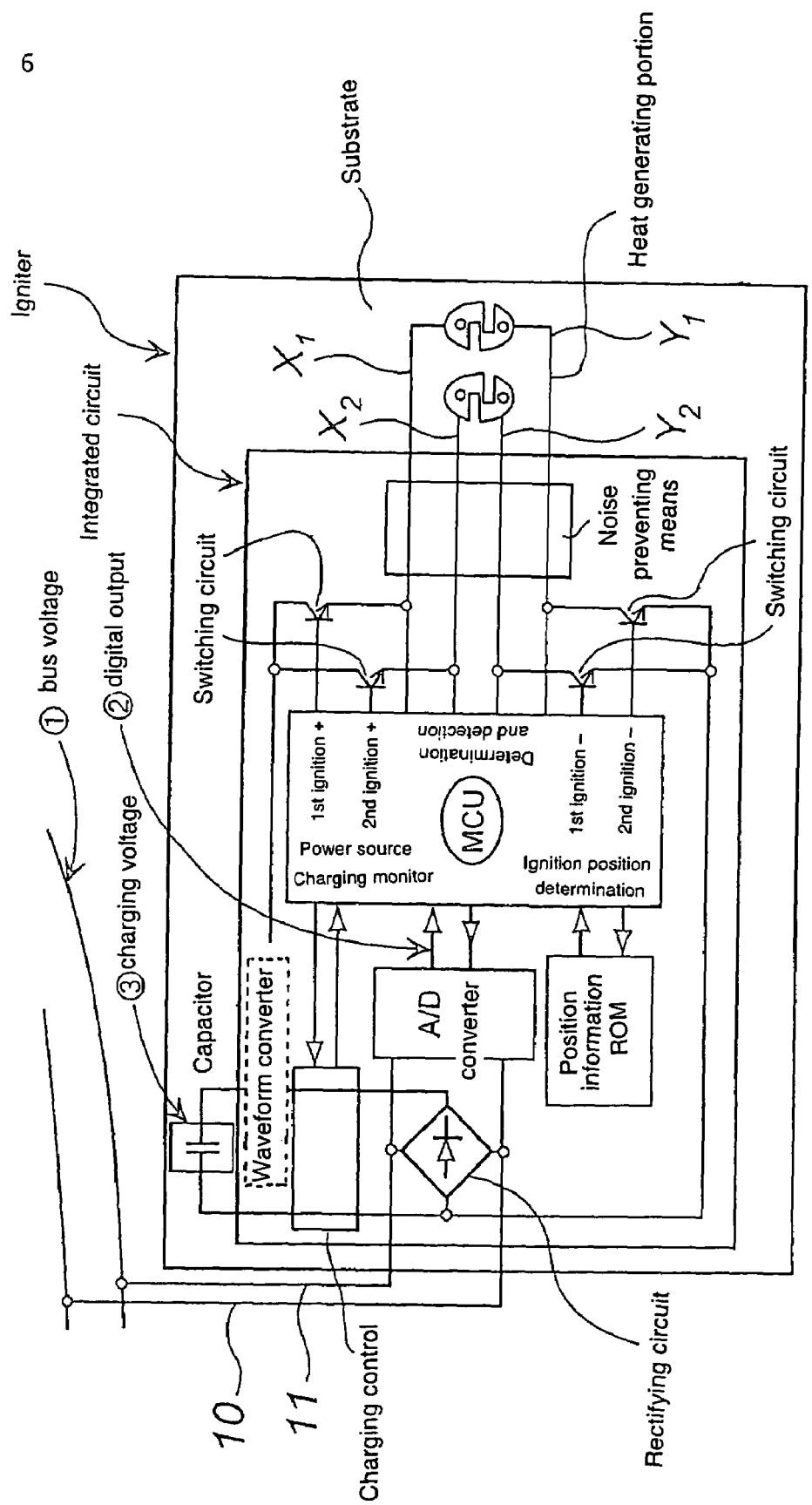
FIG. 6 is a conceptual diagram of an igniter (including two heat generating portions) used in the air bag system employing the present invention.
Figure 7:
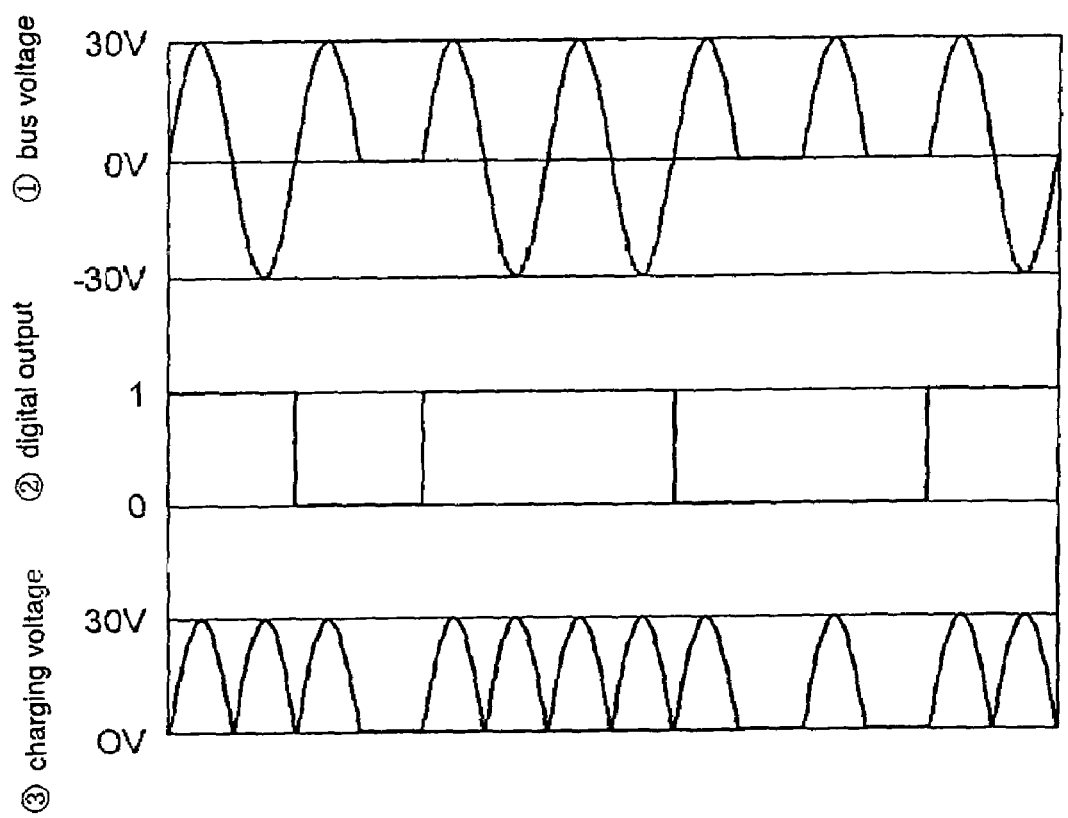
FIG. 7 is a pulse waveform diagram of a bus voltage, a digital output and a charging voltage shown in FIG. 5 and FIG. 6.

In the igniter 21 shown in FIG. 4, the substrate provided with the capacitor and the integrated circuit may have structures shown in the conceptual diagrams of FIG. 5 and FIG. 6. In FIG. 5, a single heat generating portion is provided and in FIG. 6, two heat generating portions are provided. FIG. 7 shows pulse waveforms of a bus voltage, a digital output and a charging voltage shown in FIG. 5 and FIG. 6.

In FIG. 5 and FIG. 6, a rectifying circuit having a function for, among the currents from the bus lines 10 and 11 for charging the capacitor and the required information, rectifying an alternating current to make the current flow into the capacitor as a direct current is provided between the bus lines 10 and 11 and the capacitor, In FIG. 5 and FIG. 6, a discharging waveform converting circuit (shown as a "waveform converter" with a broken line) can be provided, if required, and the discharging waveform converting circuit can be incorporated into the integrated circuit.

In FIG. 5 or FIG. 6, a switching circuit (a transistor) for shutting off a current when it is unnecessary to activate the igniter and for supplying a current when activating the igniter is provided in the integrated circuit. When the switching circuit is being closed (ON), current from the capacitor flows into the heat generating portion, and when the switching circuit is being opened (OFF), the current does not flow from the capacitor into the heat generating portion.

The switching circuit is formed with a thyristor, a MOSFET, a bipolar transistor or the like. It is desirable that the switching circuit is provided on positive and negative sides of a current path as shown in FIG. 5 in view of preventing a malfunction, but it may be provided only on the positive side. When the switching circuit is applied with, for example, a current pulse with a waveform width of 100 μsec, the switching is closed for 100 μsec and it allows current from the voltage waveform converter to flow in the heat generating portion of the igniter as a pulse with a width of 100 μsec.

After current and information supplied from the bus lines 10 and 11 are sent to the integrated circuit, they are converted to digital outputs by an A/D converter (an analog/digital converter) to be sent to an MCU (a Micro Computer Unit). Thereafter, a command is sent from the MCU to exhibit charge control information, position identification information, disconnection-detecting information of a heat generating portion or a resistance value change detecting information, and also, they are used for charging the capacitor, but not used for causing the heat generating portion to generate heat.

A varistor (non-linear resistance element) is disposed in a circuit connected between the MCU and the heat generating portion as a noise preventing means, and it serves such that the igniter is not activated erroneously with a noise generated outside the igniter.

In FIG. 5, the MCU and the heat generating portion (corresponds to the heat generating portion of the igniter 21 in FIG. 2) of the igniter are connected to each other by two conductors X and Y, and in FIG. 6, the MCU and the heat generating portion (corresponds to the heat generating portion of the igniter 31 in FIG. 3) of one of the igniters are connected to each other by two conductors $X_1$ and $Y_1$, and the MCU and the heat generating portion (corresponds to the heat generating portion of the igniter 32 in FIG. 3) of the other igniter are connected to each other by two conductors $X_2$ and $Y_2$.

Next, an operation of the air bag system employing the present invention will be explained with reference to FIG. 1, FIG. 5 and the like.

When a vehicle runs normally, disconnection-detecting information or resistance value change detecting information of the heat generating portion, detecting information for a malfunction of the capacitor, and detecting information as to whether or not an igniter having an identifying function required for activating a gas generator exists (detecting information as to whether or not an igniter having an identification function to properly activate a required gas generator such as for a driver side, a passenger side next to the driver or the like at collision is disposed rightly, or whether or not another igniter having the same identifying function is disposed duplicately) is sent from the ECU to the gas generator (the integrated circuit arranged in the igniter) through the bus lines, so that it is checked whether or not there is an abnormality. When there is an abnormality, an alarm lamp activated in linkage with the air bag system, or the like informs the abnormality, so that an early exchange of parts can be conducted to ensure the safety. Further, the capacitor of each igniter can be charged from the power source.

When a vehicle provided with the air bag system collides, information from the impact detecting sensor is sent to the ECU, and information from the ECU is sent, via the bus lines 10 and 11, to a gas generator (the integrated circuit provided in the igniter) required to inflate an air bag for a safety for a vehicle occupant.

Upon receiving this information, a required current is supplied from the capacitor for a predetermined period and the heat generating portion generates heat to ignite and burn the priming. By igniting and burning the priming, a transfer charge in FIG. 2 or FIG. 3 and also the gas generating agent are ignited and burnt to generate a gas. The gas is discharged from gas discharging ports to inflate an air bag accommodated in the module case together with the gas generator.

The switching circuit is kept in an OFF state until this information is transmitted to the integrated circuit. In order to activate the air bag system normally, it is necessary to activate the integrated circuit for 10 seconds, which is the maximum time period required until a second collision is caused after the first collision and to store, in the capacitor, energy for making the heat generating portion generate heat sufficiently. In view of this, in the present invention, the lowest charging capacitance of the capacitor required for activating the air bag system normally is obtained from the following formula (I).

$$C = 2E/V^2 \qquad (I)$$

In the formula, C represents a capacitor charging capacitance, V represents a charging voltage, and E represents the minimum ignition energy required for causing the heat generating portion of the igniter to generate heat and igniting a priming, which is obtained by the following formula (II).

$$E = I_{min}^2 \times (R_{max} \times + r_1 + r_2) \times T + w \times 10 \qquad (II)$$

$I_{min}$: minimum ignition current value (A)

$R_{max}$: the maximum resistance value of the heat generating portion (Ω)

$r_1$: an ON resistance value of the switching circuit (the maximum ON resistance value at 150° C.)(Ω)

$r_2$: a resistance value of the other elements (Ω)

T: a time period during which a current flows in the heat generating portion (sec)

w: a power consumed by the whole integrated circuit when the switching circuit is OFF (In this case, 10 in w×10 means the maximum time period elapsed from the first collision to the second collision caused at vehicle collision.)]

$I_{min}$ (the minimum ignition current value) is a current value obtained by a method of causing a current to flow in an igniter with a capacitor discharging current having a constant current rectangular waveform (a vertical axis denotes a current value (A) and a horizontal axis denotes a time (μsec)) shown with the following formula during a fixed time period or when discharging starts from the capacitor at a time t=0:

$$i(t) = (V0/R) \times e^{-t/CR}$$

(in the formula, V0 represents a capacitor charging voltage (V), R represents a circuit resistance (Ω), C represents a capacitor capacitance (μF), t represents a time (μsec), and i represents current (A)) and decreasing (or increasing) the current value for each ignition (or miss-ignition) to obtain the minimum ignition current value (Brustone method).

$R_{max}$ (the maximum resistance value of the heat generating portion) is a resistance value of a heat generating wire used in the heat generating portion shown in FIG. 4, FIG. 5 or FIG. 6.

$r_1$ (the resistance value of the switching circuit: the maximum ON resistance value at 150° C.) is the maximum ON resistance value (the maximum resistance value of the switching circuit itself when the circuit is closed to flow a current into the heat generating portion) at 150° C. in the switching circuit shown in FIG. 5 and FIG. 6.

$r_2$ (the resistance value of another element) represents a resistance value other than $r_1$ in the integrated circuit shown in FIG. 5 (a connecting portion between respective circuits in which an ignition current flows in the integrated circuit). Incidentally, power consumed by the integrated circuit itself, such as power consumed at a transistor diode constituting a logic circuit other than the switching circuit or the like is also supplied from the capacitor. As described above, it is necessary to keep the integrated circuit operational for ten seconds in which the second collision (impact) may occurs from the time when the vehicle detects the first collision (impact) to the time when the vehicle stops completely. When power consumed by the whole integrated circuit when the switching circuit is OFF is represented by w, only the energy of w×10 is consumed for 10 seconds elapsed until a collision stop or the next collision of a vehicle is caused. The charging capacitance is determined, including this amount into the amount of energy stored in the capacitor in advance.

The above-described formula (II) represents the energy amount consumed in the integrated circuit apart from the heat generating portion. Accordingly, by storing such energy lost at a portion other than the heat generating portion in the capacitor, heat can be generated securely.

When the circuit shown in FIG. 5 is provided in an igniter, as one example for operating the air bag system normally, numeral values of respective elements are set as follows.

Charging voltage (V): 20 V

Minimum ignition current value ($I_{min}$): 3.5 A

Time in which a current flows in the heat generating portion of the igniter mounted in the air bag system activated first after collision: 40 μsec $R_{max}$: 0.2Ω

$r_1$: 1.6 Ω(0.8 Ω×2)

$r_2$: 0.2 Ω w: 0.005 W

The above-described numeral values are substituted in the formula (II).

$$E=3.5^2 \times (0.2+1.6+0.2) \times 40 \times 10^{31\ 6}+0.001 \times 10 = 9.8 \times 10^{-4}+0.01 = \text{about } 0.011\ (J)$$

V=20 and E=0.011 are substituted in the formula (I).

$$C=(2 \times 0.011)/20^2 = 5.5 \times 10^{-5}\ F = 55\ \mu F$$

(2) Second Embodiment

An air bag system of the invention will be explained with reference to FIGS. 1 to 3, FIG. 9 and FIG. 10 to FIG. 12.

As shown in FIG. 1, an air bag system employing the bus system uses bus lines 10 and 11 comprising two loop wires passing through an ECU. The ECU is connected to a power source (a battery in a vehicle) and an impact detecting sensor which are not illustrated, and a capacitor as backup for supplying power when a conductor (a lead wire) connecting the ECU and the power source is disconnected by an impact at a collision of a vehicle, is further disposed. Incidentally, in the air bag system shown in FIG. 1, since the capacitor is disposed between each gas generator (igniter) and the bus lines (desirably, in the connector connecting to the igniter), the capacitor for backup may have a small capacitance (i.e., light weight), but the capacitor for backup in the conventional air bag system shown in FIG. 8 has to have a large capacitance in order to activate all the gas generators by itself at a time of disconnection of a lead wire between the battery and the ECU.

The bus lines 10 and 11 and the gas generators in a required number of module cases (which are indicated by circles. The gas generator and an air bag are accommodated in the case.) mounted to a vehicle are connected via a connector having two (or three or more when occasion demands) lead wires (conductors) to activate each gas generator.

As the gas generators in the module cases illustrated with circles in the air bag system shown in FIG. 1, ones shown in FIG. 2 or FIG. 3 can be used according to the number of the igniters. FIG. 2 is an axial sectional view of a single type (an igniter 21) gas generator in which one igniter is provided, and FIG. 3 is an axial sectional view of a dual type (igniters 31 and 32) gas generator in which two igniters are provided.

In the single type gas generator, two (or three or more when occasion demands) pins 21a and 21b are provided in the igniter 21 and they are connected to the bus lines 10 and 11 through a connector fitted into a connector insertion portion 25.

In the dual type gas generator, two (or three or more when occasion demands) pins 31a and 31b are provided in the igniter 31, two (or three or more when occasion demands) pins 32a and 32b are provided in the igniter 32, the igniters are respectively connected to the bus lines 10 and 11 through connectors fitted into connector insertion portions 35 and 36.

Figure 9:
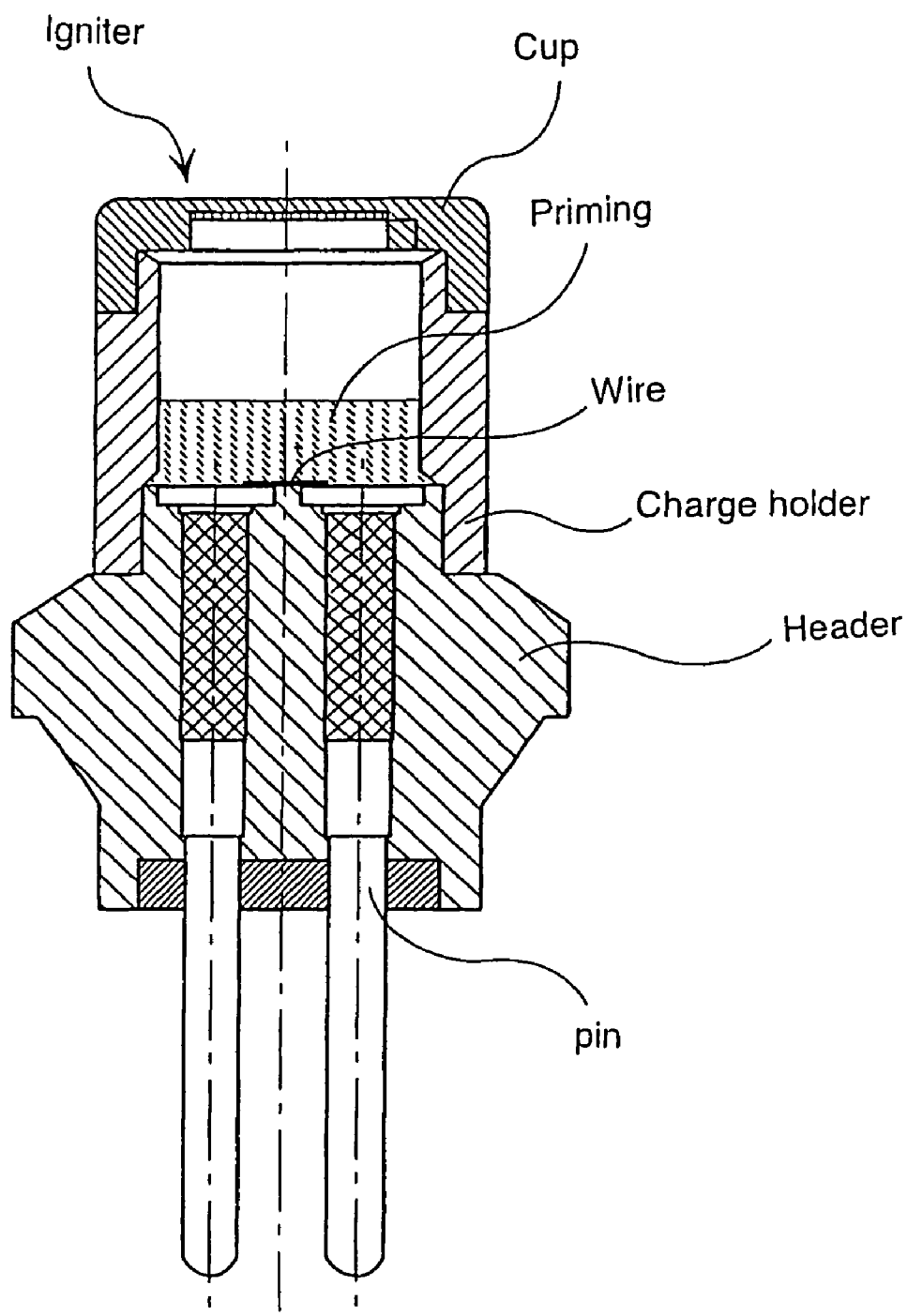
FIG. 9 is a vertical sectional view of an igniter used in the conventional air bag system.

As the igniter 21 and the igniters 31 and 32 in the gas generators shown in FIG. 2 and FIG. 3, for example, one shown in FIG. 9 can be used. FIG. 9 shows a vertical schematic sectional view of an igniter, and igniters having the same structure can be used as the igniter 21, the igniters 31 and 32.

Figure 10:
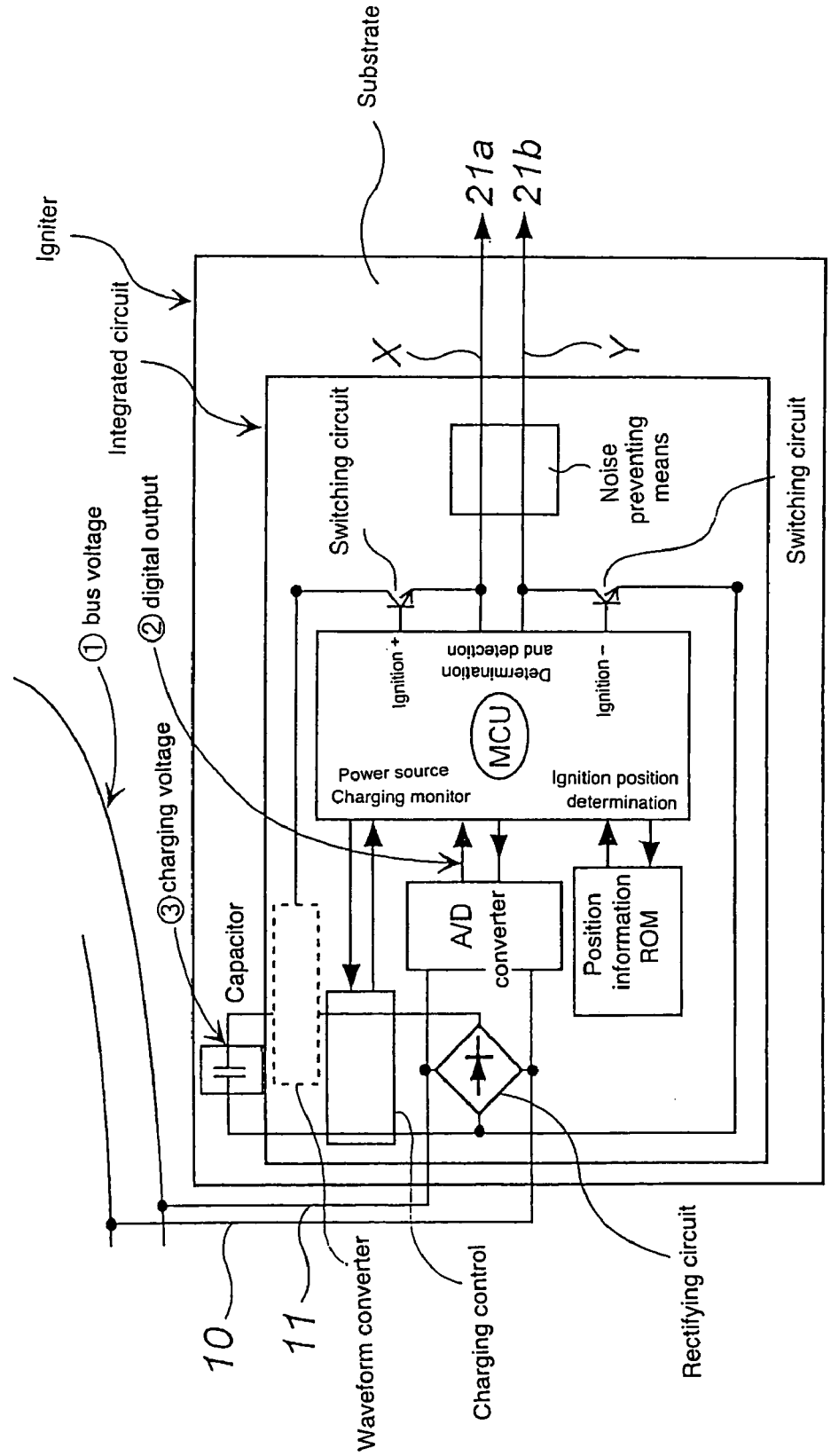
FIG. 10 is a conceptual diagram of a substrate (including a single heat generating portion) used in the air bag system of the present invention.
Figure 11:
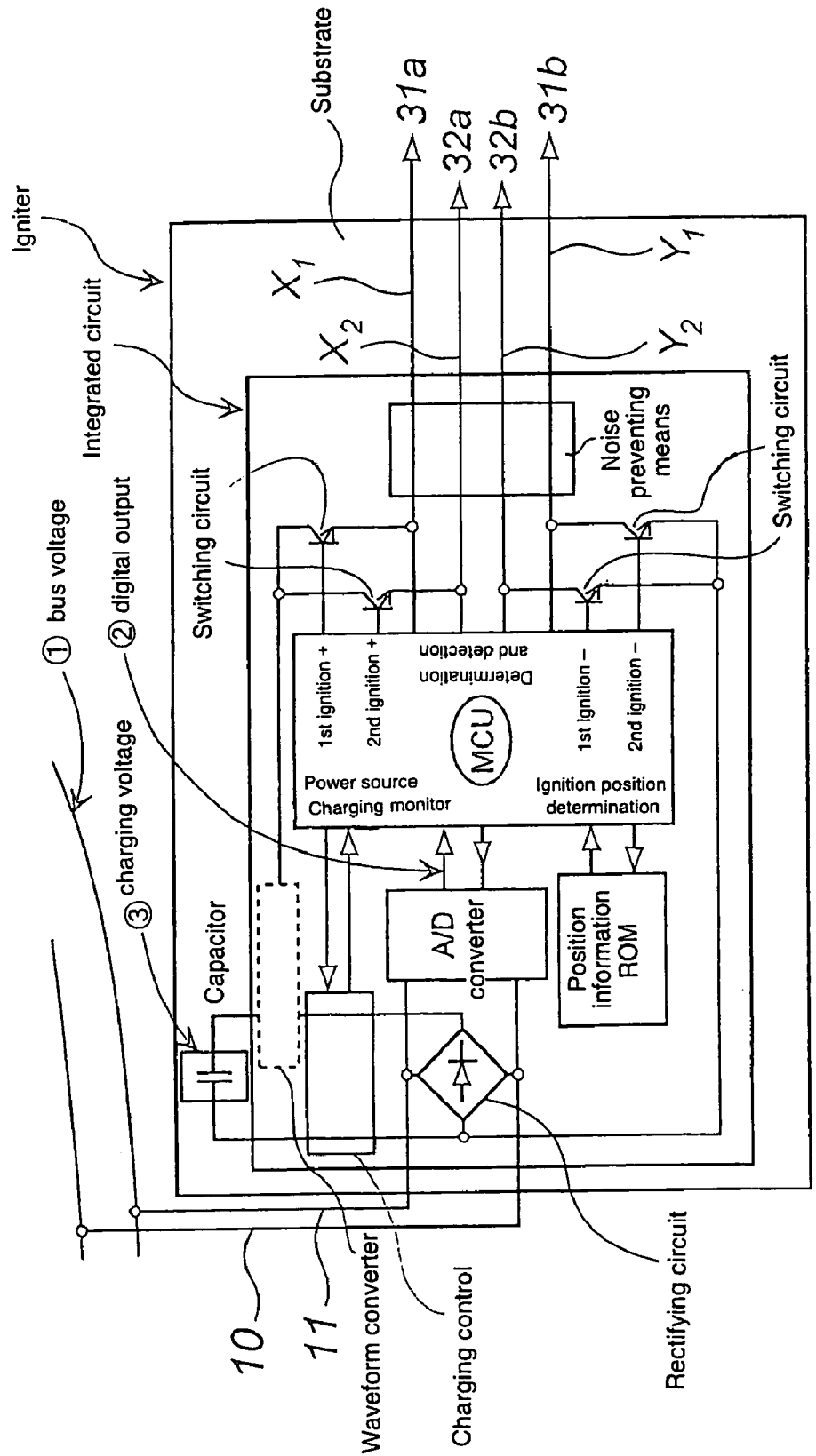
FIG. 11 is a conceptual diagram of a substrate (including two heat generating portions) used in the air bag system of the present invention.

A substrate provided with a capacitor and an integrated circuit and disposed between each gas generator (igniter) and the bus lines (desirably, in the connector connecting to the igniter) can employ a structure shown in the conceptual diagrams of FIG. 10 and FIG. 11. In FIG. 10, a single heat generating portion is provided and in FIG. 11, two heat generating portions are provided.

In FIG. 10 and FIG. 11, a rectifying circuit having a function for, among the currents from the bus lines 10 and 11 for charging the capacitor and the required information, rectifying an alternating current to make the current flow into the capacitor as a direct current is provided between the bus lines 10 and 11 and the capacitor.

In FIG. 10 and FIG. 11, a discharging waveform converting circuit (shown as a "waveform converter" with a broken line) can be provided, if required, and the discharging waveform converting circuit can be incorporated into the integrated circuit.

In FIG. 10 or FIG. 11, a switching circuit (a transistor) for shutting off a current when it is unnecessary to activate the igniter and for supplying a current when activating the igniter is provided in the integrated circuit. When the switching circuit is being closed (ON), current from the capacitor flows into the heat generating portion, and when the switching circuit is being opened (OFF), the current does not flow from the capacitor into the heat generating portion.

The switching circuit is formed with a thyrister, a MOSFET, a bipolar transistor or the like. It is desirable that the switching circuit is provided on positive and negative sides of a current path as shown in FIG. 10 in view of preventing a malfunction, but it may be provided only on the positive side. When the switching circuit is applied with, for example, a current pulse with a waveform width of 100 μsec, the switching is closed for 100 μsec and it allows current from the voltage waveform converter to flow in the heat generating portion of the igniter as a pulse with a width of 100 μsec.

After the current and information supplied from the bus lines 10 and 11 are sent to the integrated circuit, they are converted to digital outputs by an A/D converter (an analog/digital converter) to be sent to an MCU (a Micro Computer Unit). Thereafter, a command is sent from the MCU to exhibit charge control information, position identification information, disconnection-detecting information of a heat generating portion or a resistance value change detecting information, and also, they are used for charging the capacitor, but not used for causing the heat generating portion to generate heat.

A varistor (non-linear resistance element) is disposed in a circuit connected between the MCU and the heat generating portion as a noise preventing means, and it serves such that the igniter is not activated erroneously with a noise generated outside the igniter.

In a substrate shown in FIG. 10, two conductors X and Y coupled to the MCU are respectively connected to conductive pins 21a and 21b of the gas generator (the igniter 21) shown in FIG. 2.

In a substrate shown in FIG. 11, two conductors $X_1$ and $Y_1$, and $X_2$ and $Y_2$ coupled to the MCU are respectively connected to conductive pins 31a and 31b, and 32a and 32b of the gas generators (igniters 31 and 32) shown in FIG. 3.

Figure 12:
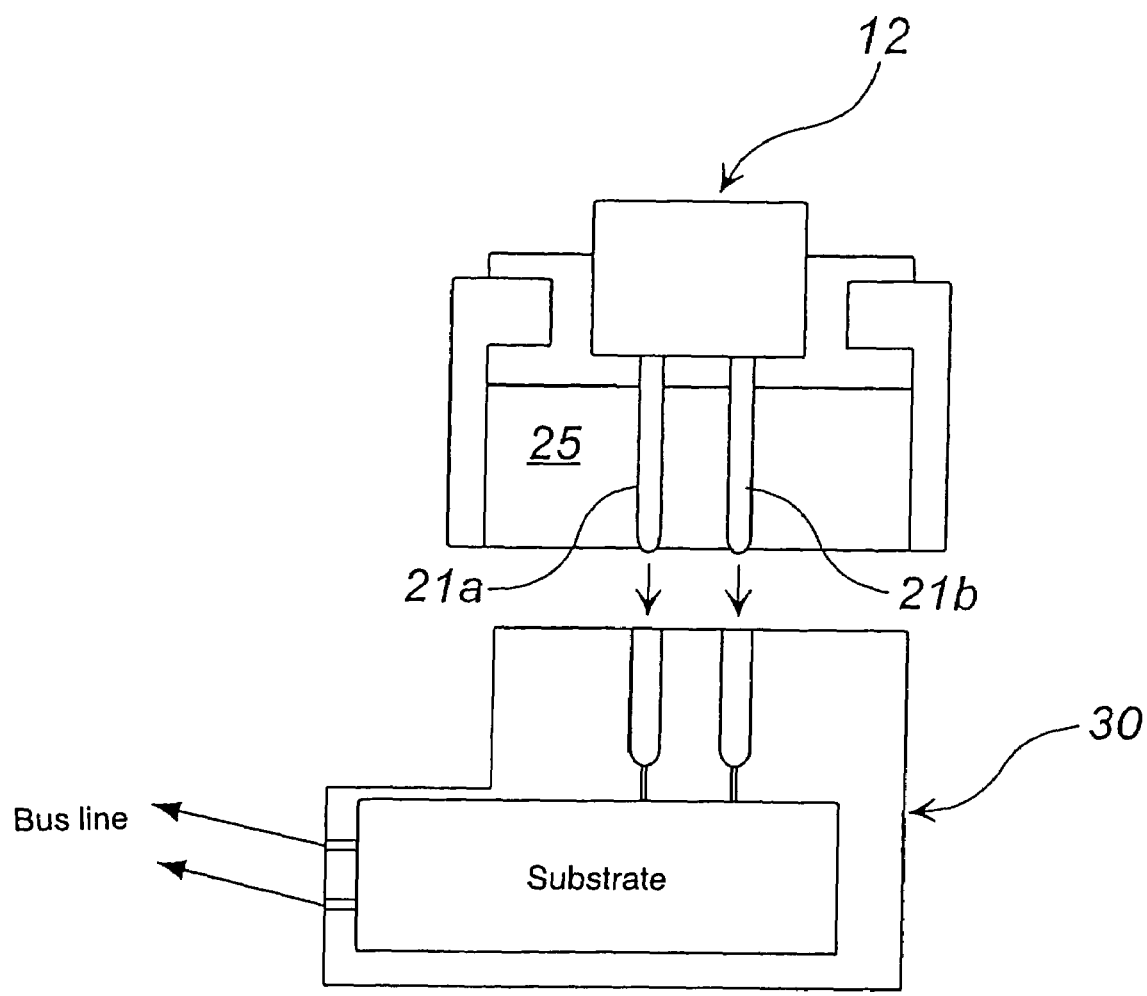
FIG. 12 is an explanatory diagram showing an arrangement of a substrate provided in the air bag system of the present invention.

The substrates shown in FIG. 10 or FIG. 11 is provided between each gas generator (igniter) and the bus lines, and it is preferably provided in the connector as shown in FIG. 12. FIG. 12 is a schematic diagram showing a connection between a connector provided with a substrate and an igniter.

A connector 30 shown in FIG. 12 is fitted into a connector insertion portion 25 (FIG. 2) to connect two conductive pins 21a and 21b and the substrate shown in FIG. 10, or the connector is fitted into connector insertion portions 35 and 36 shown in FIG. 3 to connect two conductive pins 31a and 31b, and 32a and 32b and the substrate shown in FIG. 11.

The shape or the like of the connector is not limited specifically, but when the substrate shown in FIG. 11 is provided and the connector is connected to the gas generator shown in FIG. 3, it is preferable that positioning means to make predetermined connectors fit into the connector insertion portions 35 and 36 respectively are provided in either or both of the connector insertion portions 35 and 36 and the connectors. For example, as shown in FIGS. 13(*a*) to FIG. 13(*d*), such positioning means that only one of the connectors can be fitted into the connector insertion portion 35 and only the other can be fitted into the connector insertion portion 36 can be provided.

Figure 13:
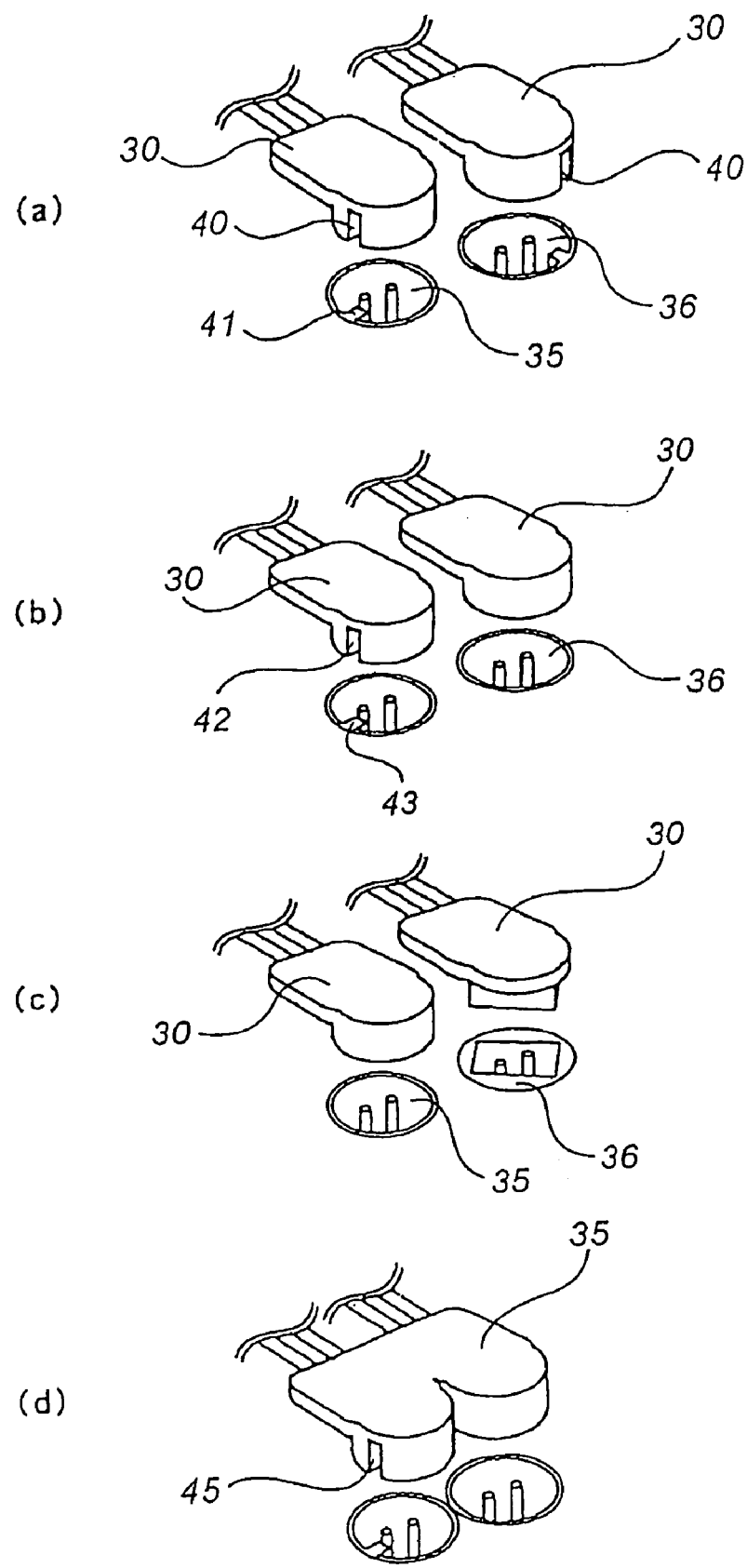
FIG. 13 is an explanatory diagram of a method of attaching a connector in the air bag system of the present invention.

In the positioning means shown in FIG. 13(*a*), a positioning groove (or protrusion) 40 is formed in the connectors, and a position of the protrusion (groove) 41 corresponding to the positioning groove (or protrusion) 40 is different for each igniter. That is, when the connectors 30 are mounted to the gas generator, the position of the groove (or the protrusion) 40 of each connector is set such that, when the connectors 30 are not mounted in their regular orientations, the connectors interfere with each other, thereby preventing the connectors from being mounted exactly.

In the positioning means shown in FIG. 13(*b*), a positioning groove (or a protrusion) 42 is provided in only one of the connectors 30. That is, the connector 30 provided with the groove (or the protrusion) 42 can be fitted into the connector insertion portion 36 which is not provided with a protrusion (or a groove) 43, but the connector 30 which is not provided with the groove (or the protrusion) 42 can not be fitted into the connector insertion portion 35 which is provided with the protrusion (or the groove) 43. As a result, a connection error of two connectors 30 does not occur.

In FIG. 13(*c*), the shapes of the respective connectors 30 and the connector insertion portions 35 and 36 are made different, so that connection error is prevented.

In FIG. 13(*d*), two connectors 30 are joined to one piece and a positioning groove (or protrusion) 45 is further formed.

In addition, the shape and arrangement of the conductive pin itself and the color of the connector and the color of the connector insertion portion can be related to each of the igniters.

Next, an operation of the igniter for the air bag system of the present invention and a method of controlling operation of the air bag system will be explained with reference to FIG. 1, FIG. 2, FIG. 10 and the like.

When a vehicle runs normally, disconnection-detecting information or resistance value change detecting information of the heat generating portion, detecting information for a malfunction of the capacitor, and detecting information as to whether or not an igniter having an identifying function required for activating a gas generator exists (detecting information as to whether or not an igniter having an identification function to properly activate a required gas generator such as for a driver side, a passenger side next to the driver or the like at collision is disposed rightly, or whether or not another igniter having the same identifying function is disposed duplicately) is sent, through the bus lines, from the ECU to the integrated circuit provided between gas generator (the igniter) and the bus lines (preferably, in the connector connected to the igniter), so that it is checked whether or not there is an abnormality. When there is an abnormality, an alarm lamp activated in linkage with the air bag system, or the like informs the abnormality, so that an early exchange of parts can be conducted to ensure the safety. Further, the capacitor of each igniter can be charged from the power source.

When a vehicle provided with the igniter for the air bag system collides, information from the impact detecting sensor is sent to the ECU, and information from the ECU is sent, via the bus lines 10 and 11, to the substrate, in FIG. 10 and FIG. 11, provided between each gas generator (the igniter), which is required to inflate an air bag for a safety for a vehicle occupant, and the bus lines.

Upon receiving this information, a required current is supplied from the capacitor for a predetermined period (the time period from the point where a current value reaches the current value corresponding to 5% of the maximum current value to the point where the current value is reduced down to the value corresponding to 5% of the maximum current value, which is within 500 μsec) and the heat generating portion generates heat to ignite and burn the priming. At this time, the waveform of the current forms a discharging waveform represented by the formula (I) when a discharging starts at a time t=0.

By igniting and burning the priming, a transfer charge in FIG. 2 or FIG. 3 and further the gas generating agent are ignited and burnt to generate a gas. The gas is discharged from gas discharging ports to inflate an air bag accommodated in the module case together with the gas generator.

The air bag system can be applied to any of a pyrotechnic inflator using a gas generating agent as an air bag inflating medium, a hybrid inflator mainly using a pressurized gas as an air bag inflating medium, and an inflator using a gas generating agent and a pressurized medium as an air bag inflating medium.

The invention claimed is:

1. A method of determining a charging capacitance of a capacitor in an air bag system having an electronic control unit for controlling activation of a gas generator, a bus line having a loop wire extending from the electronic control unit, a plurality of gas generators connected to the loop wire, each gas generator having an igniter connected to the loop wire via a connector, one of the igniter and the connector being provided with an integrated circuit having, the capacitor for providing power to a heat generating portion for igniting a priming, a switching circuit for turning ON/OFF a supplying of current to the heat generating portion, and a microcomputer unit for controlling the switching circuit, the method comprising:

determining a minimum charging capacitance of the capacitor necessary to operate the igniter by the following formula (I):

$$C = 2E/V2 \qquad (I)$$

where, C represents a capacitor charging capacitance, V represents a charging voltage, and E represents a minimum ignition energy required for making the heat generating portion of the igniter generate heat to ignite the priming, the minimum ignition energy being obtained by the following formula (II):

$$E = I\min 2'(R\max + r1 + r2)'T + w'10 \qquad (II)$$

where, Imin: a minimum ignition current value (A),
Rmax: a maximum resistance value of the heat generating portion (W),
r1: a maximum ON resistance value of the switching circuit at 150° C.(W),
r2: a resistance value of elements other than the switching circuit (W),
T: a time period in which a current flows in the heat generating portion (sec), and
w: a power consumed by an entire integrated circuit when the switching circuit is OFF, and where 10 in w'10 is a maximum time period elapsed from a first collision to a second collision which may occur during a vehicle collision.

2. A method of determining a charging capacitance of a capacitor in an air bag system, comprising:

providing an electronic control unit for controlling activation of an igniter;
providing a bus line having a loop wire extending from the electronic control unit;
providing a plurality of gas generators connected to the loop wire, each gas generator having,
an igniter connected to the loop wire via a connector, one of the igniter and the connector being provided with an integrated circuit having,
the capacitor for providing power to a heat generating portion for igniting a priming,
a switching circuit for turning ON/OFF a supplying of current to the heat generating portion, and
a microcomputer unit for controlling the switching circuit; and
determining a minimum charging capacitance of the capacitor necessary to operate the igniter by the following formula (I):

$$C = 2E/V2 \qquad (I)$$

where, C represents a capacitor charging capacitance, V represents a charging voltage, and E represents a minimum ignition energy required for making the heat generating portion of the igniter generate heat to ignite the priming, the minimum ignition energy being obtained by the following formula (II):

$$E = I\min 2'(R\max + r1 + r2)'T + w'10 \qquad (II)$$

where, Imin: a minimum ignition current value (A),
Rmax: a maximum resistance value of the heat generating portion (W),
r1: a maximum ON resistance value of the switching circuit at 150° C.(W),
r2: a resistance value of elements other than the switching circuit (W),
T: a time period in which current flows in the heat generating portion (sec), and
w: a power consumed by an entire integrated circuit when the switching circuit is OFF, and where 10 in w'10 is a maximum time period elapsed from a first collision to a second collision which may occur during a vehicle collision.

* * * * *